(12) United States Patent
Kim et al.

(10) Patent No.: US 11,387,216 B2
(45) Date of Patent: Jul. 12, 2022

(54) SEMICONDUCTOR MEMORY DEVICE

(71) Applicant: SK hynix Inc., Icheon-si (KR)

(72) Inventors: Jin Ho Kim, Icheon-si (KR); Young Ki Kim, Icheon-si (KR); Sang Hyun Sung, Icheon-si (KR); Sung Lae Oh, Icheon-si (KR); Byung Hyun Jun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 123 days.

(21) Appl. No.: 16/907,094

(22) Filed: Jun. 19, 2020

(65) Prior Publication Data

US 2021/0242175 A1 Aug. 5, 2021

(30) Foreign Application Priority Data

Feb. 5, 2020 (KR) .................. 10-2020-0013456

(51) Int. Cl.
*H01L 25/065* (2006.01)
*H01L 25/18* (2006.01)
*H01L 23/00* (2006.01)
*H01L 23/552* (2006.01)
*H01L 49/02* (2006.01)

(52) U.S. Cl.
CPC ........ *H01L 25/0657* (2013.01); *H01L 23/552* (2013.01); *H01L 24/08* (2013.01); *H01L 25/18* (2013.01); *H01L 28/60* (2013.01); *H01L 2224/08145* (2013.01); *H01L 2225/06524* (2013.01); *H01L 2225/06537* (2013.01); *H01L 2924/1431* (2013.01); *H01L 2924/14511* (2013.01); *H01L 2924/19041* (2013.01); *H01L 2924/19104* (2013.01); *H01L 2924/3025* (2013.01)

(58) Field of Classification Search
None
See application file for complete search history.

(56) References Cited

U.S. PATENT DOCUMENTS 9,558,945 B2 1/2017 Fukuzumi et al.
10,297,578 B2 5/2019 Tagami et al.
10,319,730 B2* 6/2019 Matsuo .................. H01L 25/18
2020/0295037 A1* 9/2020 Iijima ..................... H01L 24/09

FOREIGN PATENT DOCUMENTS

CN 107658315 A 2/2018

* cited by examiner

*Primary Examiner* — Long Pham

(57) ABSTRACT

A semiconductor memory device includes a plurality of first pads disposed in one surface of a memory chip which includes a memory cell array and a plurality of row lines coupled to the memory cell array, and coupled to the row lines, respectively; and a plurality of second pads disposed in one surface of a circuit chip which is boned to the one surface of the memory chip, coupled to pass transistors, respectively, of the circuit chip, and bonded to the first pads, respectively. The second pads are aligned with the pass transistors, with the same pitch as a pitch of the pass transistors.

17 Claims, 13 Drawing Sheets

SEMICONDUCTOR MEMORY DEVICE

CROSS-REFERENCE TO RELATED APPLICATION

The present application claims priority under 35 U.S.C. § 119(a) to Korean Patent Application No. 10-2020-0013456 filed in the Korean Intellectual Property Office on Feb. 5, 2020, which is incorporated herein by reference in its entirety.

BACKGROUND

1. Technical Field

Various embodiments generally relate to a semiconductor memory device, and more particularly, to a semiconductor memory device having a structure in which a memory chip and a circuit chip are bonded.

2. Related Art

A technology has been proposed in which a memory cell array and a logic circuit for controlling the same are fabricated on separate chips, and a semiconductor memory device is manufactured by bonding a memory chip with the memory cell array and a circuit chip with the logic circuit.

SUMMARY

Various embodiments are directed to structures and devices for reducing the size of a semiconductor memory device.

In an embodiment, a semiconductor memory device may include: a plurality of first pads, disposed in one surface of a memory chip, coupled to a plurality of row lines included in a memory cell array of the memory chip; and a plurality of second pads, disposed in one surface of a circuit chip and bonded to the plurality of first pads, coupled to a plurality of pass transistors of the circuit chip. The second pads are aligned with the pass transistors at the same pitch as a pitch of the pass transistors.

In an embodiment, a semiconductor memory device may include: a memory chip, and a circuit chip bonded onto the memory chip. The memory chip includes a memory cell array, and a first pad layer with a plurality of first pads respectively coupled to a plurality of row lines of the memory cell array. The circuit chip includes a plurality of pass transistors, and a second pad layer with a plurality of second pads that are respectively coupled to the plurality of pass transistors and respectively bonded to the plurality of first pads. Each of the plurality of second pads is disposed within a pitch of a corresponding pass transistor.

In an embodiment, a semiconductor memory device may include: a memory chip including a memory cell array coupled to a plurality of row lines terminating at different lengths to define a plurality of step portions respectively coupled to a plurality of first pads defined on one surface of the memory chip; and a circuit chip with a plurality of second pads, defined on one surface of the circuit chip, respectively coupled to a plurality of pass transistors and bonded to the plurality of first pads defined on the one surface of the memory chip. The first pads are aligned with the step portions at the same pitch as a pitch of the step portions.

In an embodiment, a semiconductor memory device may include: a memory chip, and a circuit chip stacked on the memory chip. The memory chip includes row lines, alternately stacked with interlayer dielectric layers on a first substrate, extending in different lengths to define step portions, which are coupled to a plurality of first pads disposed in a first pad layer. The circuit chip includes a plurality of pass transistors, defined on a second substrate, that are respectively coupled to a plurality of second pads, which are defined in a second pad layer and are respectively bonded to the first pads. Each of the plurality of first pads is disposed within a pitch of a step portion coupled thereto.

DETAILED DESCRIPTION

Figure 1:
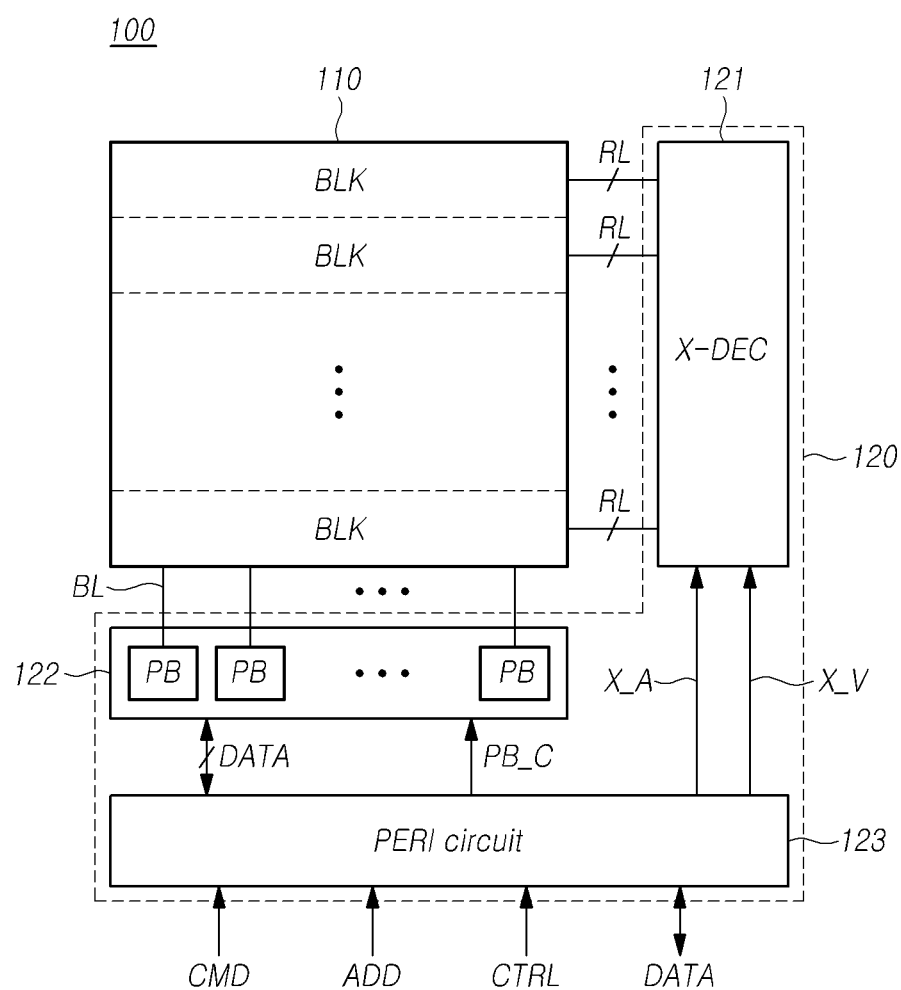
FIG. 1 is a block diagram illustrating a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor which are coupled in series.

The memory cell array 110 may be coupled to the row decoder 121 through a plurality of row lines RL. The row lines RL may include at least one drain select line, a plurality of word lines and at least one source select line. The memory cell array 110 may be coupled to the page buffer circuit 122 through a plurality of bit lines BL.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110. In order to transfer operating voltages to the row lines RL, the row decoder 121 may include a plurality of pass transistors, which are coupled to the row lines RL. The operating voltage X_V may be a high voltage that is provided to the word lines of the selected memory block BLK. In order to transfer the high voltage, the pass transistors may be configured with high-voltage transistors.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells that are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Hereinbelow, in the accompanying drawings, a direction orthogonal to the top surface of a substrate is defined as a first direction FD, and two directions parallel to the top surface of the substrate and intersecting with each other are defined as a second direction SD and a third direction TD, respectively. For example, the first direction FD may correspond to the stack direction of a memory chip and a circuit chip, the second direction SD may correspond to the arrangement direction of bit lines, and the third direction TD may correspond to the extending direction of the bit lines. The second direction SD and the third direction TD may intersect substantially perpendicularly with each other. In the following descriptions, the term 'vertical' or 'vertical direction' will be used as substantially the same meaning as the first direction FD. In the drawings, a direction indicated by an arrow and a direction opposite thereto represent the same direction.

Figure 2:
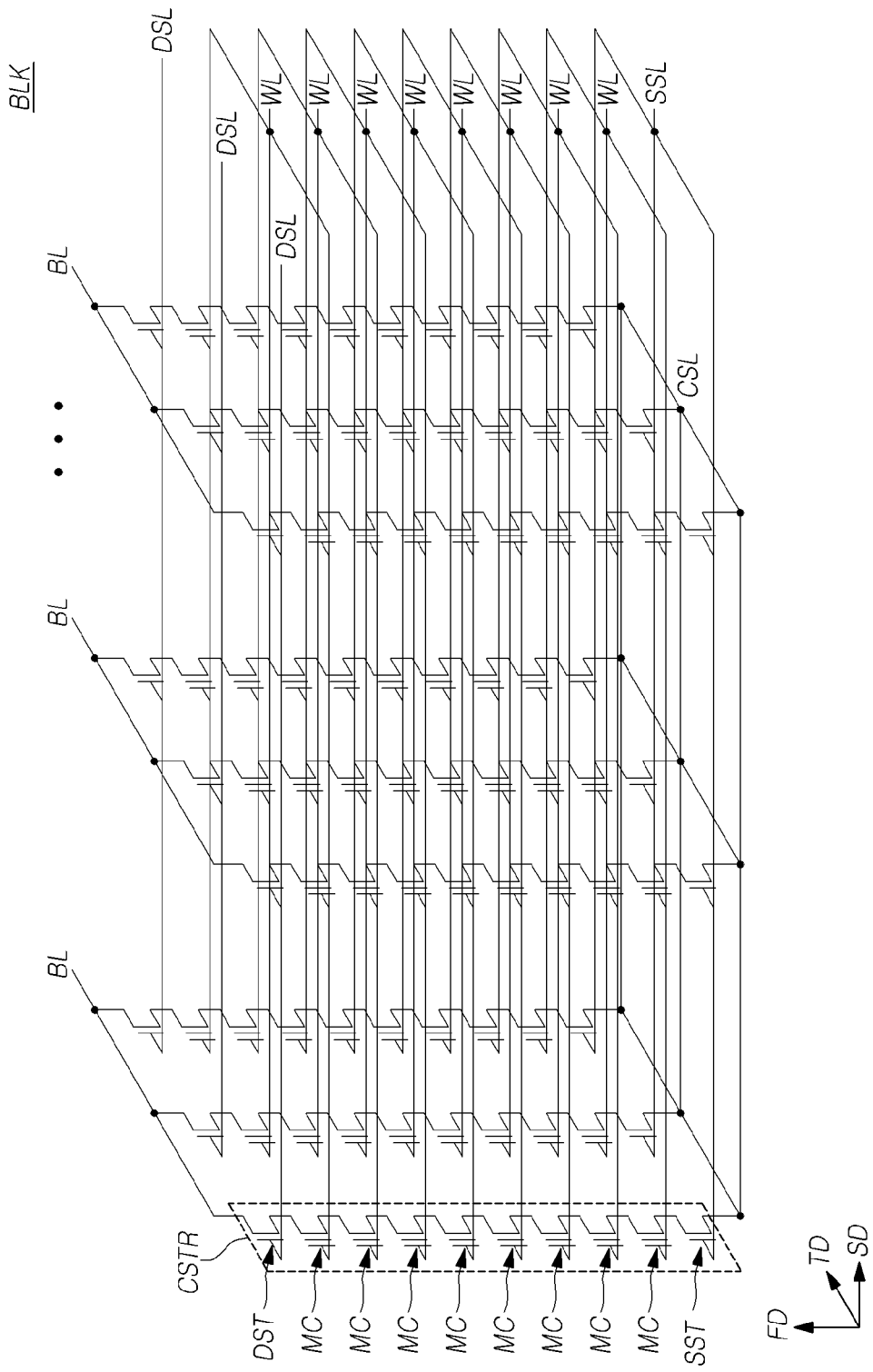
FIG. 2 is an equivalent circuit diagram illustrating one of memory blocks illustrated in FIG. 1.

FIG. 2 is an equivalent circuit diagram illustrating one of the memory blocks BLK illustrated in FIG. 1.

Referring to FIG. 2, the memory block BLK may include a plurality of cell strings CSTR, which are coupled between a plurality of bit lines BL and a common source line CSL. The bit lines BL may extend in the third direction TD and may be arranged in the second direction SD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the first direction FD.

Drain select lines DSL, a plurality of word lines WL and a source select line SSL may be stacked between the bit lines BL and the common source line CSL in the first direction FD. The drain select lines DSL may be coupled to the gates, respectively, of corresponding drain select transistors DST. Each of the word lines WL may be coupled to the gates of corresponding memory cells MC. The source select line SSL may be coupled to the gates of source select transistors SST. Memory cells MC that are coupled in common to one word line WL may configure one page. A semiconductor memory device may perform a read operation in units of a page.

Figure 3:
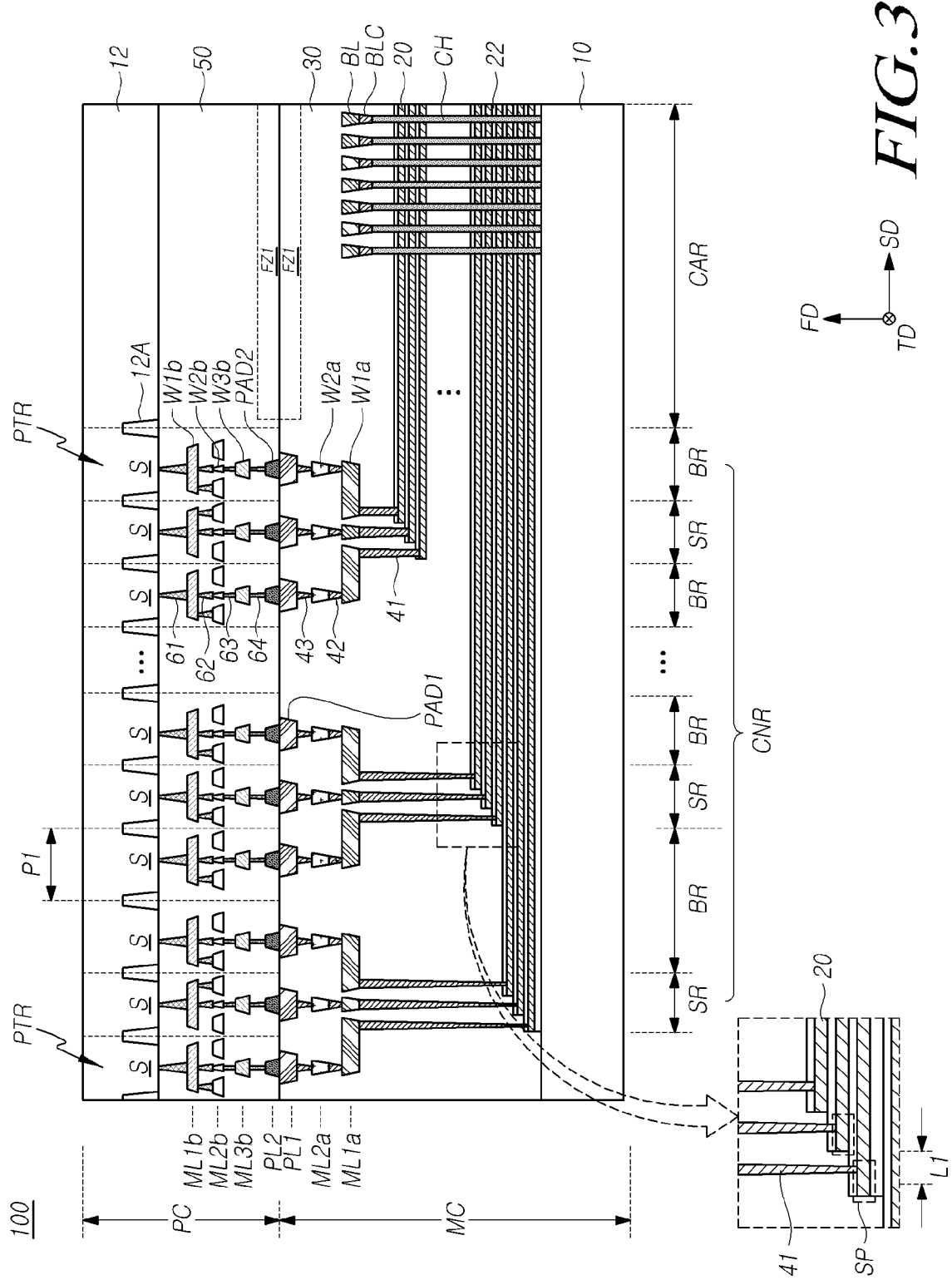
FIG. 3 is a cross-sectional view illustrating a semiconductor memory device in accordance with an embodiment of the disclosure.
Figure 4:
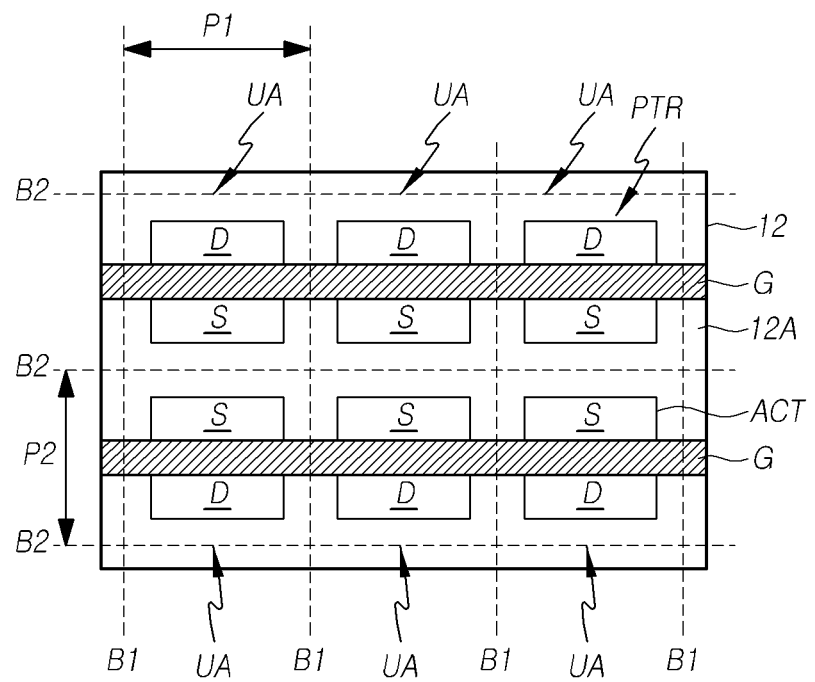
FIG. 4 is a layout diagram illustrating a disposition of pass transistors illustrated in FIG. 3.
Figure 4:
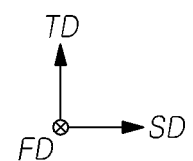
Figure 5:
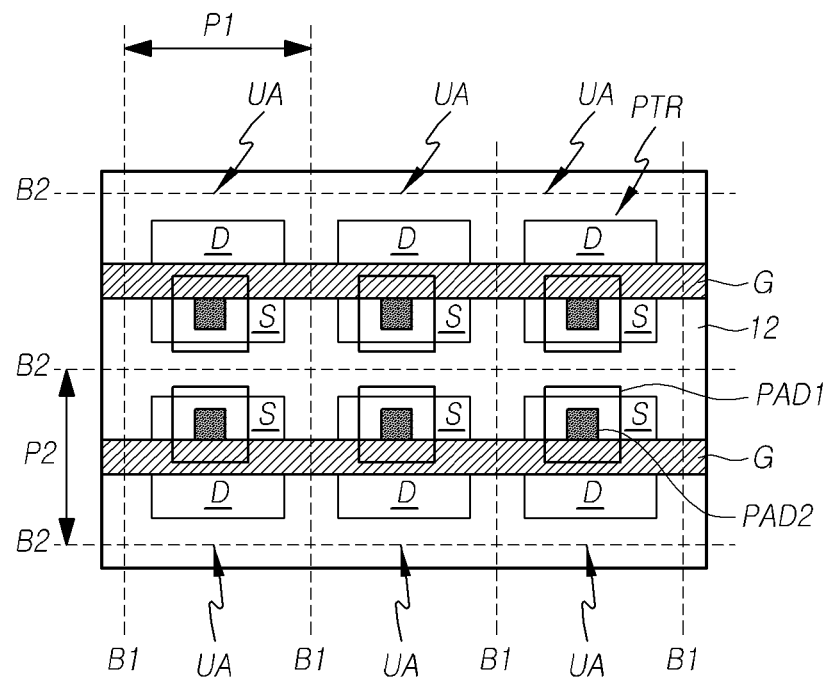
FIG. 5 is a layout diagram illustrating first and second pads added to FIG. 4.
Figure 5:
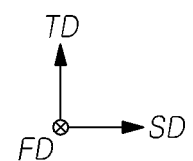

FIG. 3 is a cross-sectional view illustrating a semiconductor memory device in accordance with an embodiment of the disclosure. FIG. 4 is a layout diagram illustrating a disposition of pass transistors illustrated in FIG. 3, and FIG. 5 is a layout diagram illustrating first and second pads added to FIG. 4.

Referring to FIG. 3, a semiconductor memory device 100 in accordance with an embodiment of the disclosure may include a memory chip MC and a circuit chip PC, which is stacked on the memory chip MC in the first direction FD. The semiconductor memory device 100 may have a POC (peripheral over cell) structure.

The memory chip MC may include a plurality of electrode layers 20 and a plurality of interlayer dielectric layers 22 which are alternately stacked on a first substrate 10 in the first direction FD. The first substrate 10 may include, for example, at least one selected from the group including a monocrystalline silicon layer, an SOI (silicon on insulator) layer, a silicon layer formed on a silicon germanium (SiGe) layer, a monocrystalline silicon layer formed on a dielectric layer and a polysilicon layer formed on a dielectric layer.

The electrode layers 20 may include a conductive material. For example, the electrode layers 20 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 22 may, for example, include silicon oxide.

The electrode layers 20 may configure row lines. At least one layer from the lowermost layer among the electrode layers 20 may configure a source select line. At least one layer from the uppermost layer among the electrode layers 20 may configure a drain select line. The electrode layers 20 between the source select line and the drain select line may configure word lines.

The semiconductor memory device 100 may include a cell region CAR and a coupling region CNR. The cell region CAR and the coupling region CNR may be sequentially disposed in the second direction SD. A plurality of vertical channels CH may be defined in the cell region CAR. The plurality of vertical channels CH may pass through the electrode layers 20 and the interlayer dielectric layers 22 in the first direction FD. While not illustrated, each of the vertical channels CH may include a channel layer and a gate dielectric layer. The channel layer may include polysilicon or monocrystalline silicon, and may include a P-type impurity such as boron (B) in some regions. The gate dielectric layer may include a tunnel dielectric layer, a charge storage layer and a blocking layer which are sequentially stacked from the outer wall of the channel layer in a direction perpendicular to the first direction FD. In some embodiments, the gate dielectric layer may have an ONO (oxide-nitride-oxide) stack structure in which an oxide layer, a nitride layer and an oxide layer are sequentially stacked. Source select transistors may be configured where the source select line surrounds the vertical channels CH, and memory cells may be configured where the word lines surround the vertical channels CH. Drain select transistors may be configured where the drain select line surrounds the vertical channels CH. The source select transistors, the memory cells and the drain select transistors may configure a memory cell array. The cell region CAR may be defined as a region in which the memory cell array is disposed.

The electrode layers 20 may extend in different lengths from the cell region CAR to the coupling region CNR in the second direction SD, and, in the coupling region CNR, each of the electrode layers 20 may terminate in a step portion SP that projects further than other electrode layers 20 positioned thereon. A step structure may be formed by the step portions SP of the electrode layers 20.

The coupling region CNR may be divided into a plurality of step regions SR and a plurality of buffer regions BR. The step portions SP of the electrode layers 20 may be positioned in the step regions SR. The step regions SR may be disposed or arranged in the second direction SD. Each of the buffer regions BR may be disposed between adjacent step regions SR. Thus, the plurality of step regions SR and the plurality of buffer regions BR may be alternately disposed in the second direction SD.

A first dielectric layer 30 may be defined on the first substrate 10 to cover the electrode layers 20 and the interlayer dielectric layers 22, which are alternately stacked, and the vertical channels CH. The top surface of the first dielectric layer 30 may configure one surface of the memory chip MC, which is bonded to the circuit chip PC. A plurality of metal layers ML1a and ML2a may be defined in the first dielectric layer 30. A first pad layer PL1 may be defined in the top surface of the first dielectric layer 30. The metal layer ML2a may be disposed over the metal layer ML1a, and the first pad layer PL1 may be disposed over the metal layer ML2a.

A plurality of bit lines BL and a plurality of wiring lines W1a may be defined in the metal layer ML1a. The bit lines BL may be disposed in the cell region CAR. Bit line contacts BLC may be defined under the bit lines BL to couple the bit lines BL and the vertical channels CH. Contacts 41 may be defined under the wiring lines W1a to couple the wiring lines W1a and the step portions SP of the electrode layers 20.

A plurality of wiring lines W2a may be defined in the metal layer ML2a. Contacts 42 may be defined under the respective wiring lines W2a to couple the wiring lines W2a and the wiring lines W1a. A plurality of first pads PAD1 may be defined in the first pad layer PL1. Contacts 43 may be defined under the respective first pads PAD1 to couple the first pads PAD1 and the wiring lines W2a. FIG. 3 illustrates a structure in which the electrode layers 20 defined in the memory chip MC are coupled to pass transistors PTR defined in the circuit chip PC, and each first pad PAD1 may be coupled to a step portion SP of an electrode layer 20 through the wiring lines W1a and W2a and the contacts 41 to 43.

Referring to FIGS. 3 and 4, an isolation layer 12A may be defined in the coupling region CNR of a second substrate 12 to define active regions ACT. The active regions ACT may be arranged in the second direction SD and the third direction TD in an array-like manner. Gates G that traverse the active regions ACT in the second direction SD may be defined on the second substrate 12, and drain regions D and source regions S may be defined in the active regions ACT on opposite sides of the gates G. In each of the active regions ACT, each pass transistor PTR is configured by a gate G and a drain region D and a source region S. As active regions ACT may be arranged in the second direction SD and the third direction TD, corresponding pass transistors PTR may also be arranged in the second direction SD and the third direction TD.

A first boundary B1 may be defined between pass transistors PTR adjacent to each other in the second direction SD. The first boundary B1 may correspond to the center line of the isolation layer 12A which isolates the pass transistors PTR adjacent to each other in the second direction SD. In the present specification, a center line may mean a line which extends along the widthwise center of a component or a line which itself extends along the center of a separation distance between components.

A separation distance between first boundaries B1 adjacent to each other in the second direction SD may be defined as a pitch of the pass transistors PTR in the second direction SD. The pitch of the pass transistors PTR in the second direction SD may be designated P1.

A second boundary B2 may be defined between pass transistors PTR adjacent to each other in the third direction TD. The second boundary B2 may correspond to the center line of the isolation layer 12A which isolates the pass transistors PTR adjacent to each other in the third direction TD. A separation distance between the second boundaries B2 adjacent to each other in the third direction TD may be defined as a pitch of the pass transistors PTR in the third direction TD. The pitch of the pass transistors PTR in the third direction TD may be designated P2.

A unit region UA may be defined by two first boundaries B1 adjacent to each other in the second direction SD and two second boundaries B2 adjacent to each other in the third direction TD. A length of the unit region UA in the second direction SD may be P1, and a length of the unit region UA in the third direction TD may be P2. One pass transistor PTR may be disposed in each unit region UA. The unit region UA may be defined as a region used for the disposition of one pass transistor PTR.

Referring to FIG. 3, a second dielectric layer 50 may be defined on the second substrate 12 to cover the pass transistors PTR. The top surface of the second dielectric layer 50 may configure one surface of the circuit chip PC, which is bonded to the memory chip MC. A plurality of metal layers ML1b to ML3b may be defined in the second dielectric layer 50. A second pad layer PL2 may be defined in the top surface of the second dielectric layer 50. The metal layer ML2b may be disposed over the metal layer ML1b, and the metal layer ML3b may be disposed over the metal layer ML2b. The second pad layer PL2 may be disposed over the metal layer ML3b.

A plurality of wiring lines W1b may be defined in the metal layer ML1b. Contacts 61 may be defined under the respective wiring lines W1b to couple the wiring lines W1b and the source regions S of the pass transistors PTR. A plurality of wiring lines W2b may be defined in the metal layer ML2b. Contacts 62 may be defined under the respective wiring lines W2b to couple the wiring lines W2b and the wiring lines W1b. A plurality of wiring lines W3b may be defined in the metal layer ML3b. Contacts 63 may be defined under the respective wiring lines W3b to couple the wiring lines W3b and the wiring lines W2b.

A plurality of second pads PAD2 may be defined in the second pad layer PL2. Contacts 64 may be defined under the respective second pads PAD2 to couple the second pads PAD2 and the wiring lines W3b. Each of the second pads PAD2 may be coupled to the source region S of one of the pass transistors PTR through the wiring lines W1b, W2b and W3b and the contacts 61 to 64. The memory chip MC and the circuit chip PC may be bonded to each other such that the first pads PAD1 and the corresponding second pads PAD2 are coupled with each other.

The pass transistors PTR may be configured by high-voltage transistors. Each of the high-voltage transistors configuring the pass transistors PTR requires a wider area than a low-voltage transistor to withstand a high voltage. That is to say, each of the pass transistors PTR needs to be fabricated in a size large enough to transfer the high voltage.

A pitch of the step portions SP in the second direction SD may be smaller than the pitch P1 of the pass transistors PTR in the second direction SD. For example, the pitch of the step portions SP of the electrode layers 20 in the second direction SD may be L1, which may be a value smaller than P1.

Due to the size difference between the pitch L1 of the step portions SP and the pitch P1 of the pass transistors PTR, it is possible that a step portion SP and the source region S of the corresponding pass transistor PTR may not overlap with each other in the first direction FD. In order to couple the step portions SP and the source regions S of the pass transistors PTR that do not overlap with each other in the first direction FD, at least one of the wiring lines W1a and at least one of the wiring lines W2a respectively defined in at least one of the metal layers ML1a and at least one of the metal layers ML2a of the memory chip MC may be configured by redistribution lines which extend in a direction parallel to a plane defined by the second direction SD and the third direction TD. FIG. 3 illustrates an example in which the wiring lines W1a of the metal layer ML1a are configured by redistribution lines.

Referring to FIGS. 3 and 5, the second pads PAD2 may be aligned with the pass transistors PTR, with the same pitch as the pass transistors PTR. Each of the second pads PAD2 may be disposed within the pitch of the pass transistor PTR coupled thereto.

Like the second pads PAD2, the first pads PAD1 may also be aligned with the pass transistors PTR, with the same pitch as the pass transistors PTR. Each of the first pads PAD1 may be disposed within the pitch of the pass transistor PTR coupled thereto. Like the pass transistors PTR, which are arranged with constant pitches in the second direction SD and the third direction TD, the first and second pads PAD1 and PAD2 may also be arranged with the constant pitches in the second direction SD and the third direction TD.

The above-described disposition of the second pads PAD2 not only makes it possible to shorten the lengths of the wiring lines W1b, W2b and W3b coupling the pass transistors PTR and the second pads PAD2, but also enables a uniform distribution of the wiring lines W1b, W2b and W3b and the contacts 61 to 64. For example, the wiring lines W1b, W2b and W3b and the contacts 61 to 64 that couple each pass transistor PTR and each second pad PAD2 may be disposed within the pitch of the pass transistor PTR coupled thereto. Each of the wiring lines W1b, W2b and W3b may have a short length in order to be to be disposed within a pitch area of the pass transistor PTR defined by the pitch in the second direction SD and the pitch in the third direction TD. The same structure of the wiring lines W1b, W2b and W3*b* and the contacts 61 to 64 may be provided for each pitch of the pass transistors PTR, and accordingly, the wiring lines W1*b*, W2*b* and W3*b* and the contacts 61 to 64 may form the uniform distribution.

Reducing the number of manufacturing steps in a manufacturing process is a very important factor in reducing manufacturing time and manufacturing cost. Further, by simplifying the manufacturing process through reducing the number of manufacturing steps, it is possible to reduce failures occurring during the manufacturing process. According to embodiments disclosed herein, since it is possible to shorten the lengths of the wiring lines W1*b* to W3*b* of the circuit chip PC, an area required for the disposition of the wiring lines W1*b* to W3*b* may be reduced, which may contribute to reducing the number of metal layers of the circuit chip PC. Therefore, by reducing the number of manufacturing steps required to form metal layers, it is possible to reduce manufacturing time and manufacturing cost, and by simplifying a manufacturing process, it is possible to suppress failures occurring during the manufacturing process.

In the first and second pad layers PL1 and PL2, regions where the first and second pads PAD1 and PAD2 are not disposed may be defined as pad-free zones FZ1. The pad-free zones FZ1 may not overlap with the pass transistors PTR. In the case where the pass transistors PTR are disposed only in the coupling region CNR and are not disposed in the cell region CAR, the first and second pads PAD1 and PAD2 may be disposed only in the coupling region CNR and may not be disposed in the cell region CAR. In this case, the pad-free zone FZ1 may be defined in the cell region CAR.

The pad-free zones FZ1 may be utilized for the disposition of elements, other than pads, required in a semiconductor memory device, such as for example, wiring lines, shield patterns, capacitors and the like. Among the elements, there may be an element that needs to be disposed in a relatively wide continuous space. In order to increase the utilization efficiency of the first and second pad layers PL1 and PL2, the pad-free zones FZ1 having relatively wide, continuous shapes in the second direction SD and third direction TD should be provided.

In other embodiments, the first and second pads PAD1 and PAD2 may be randomly and irregularly disposed, so each pad-free zone FZ1 may be provided in a discontinuous shape with a relatively narrow area. In this case, it may be impossible to dispose an element that needs to be disposed in a wider area in each of the pad-free zones FZ1, so an increase in layout area or an additional layer may be required. However, if a layout area is increased, then the size of the semiconductor memory device 100 may increase, and if an additional layer is formed, then the number of manufacturing steps may increase. Both cases result in an increase in manufacturing time and in manufacturing cost, and in an increased possibility of failure during a manufacturing process.

According to an embodiment, by disposing the first and second pads PAD1 and PAD2 to be aligned with the pitches of the pass transistors PTR arranged with the constant pitches in the second direction SD and the third direction TD, the pad-free zones FZ1 each having a continuous shape with a relatively wide area may be configured in the first and second pad layers PL1 and PL2. Therefore, since it is possible to dispose, in the pad-free zone FZ1, an element which needs to be disposed in a relatively wide continuous space, it is not necessary to increase a layout area or form an additional layer for the disposition of additional required elements. Thus, it is possible to reduce the size of the semiconductor memory device 100. Further, by omitting a manufacturing step necessary to form an additional layer, it is possible to reduce manufacturing time and manufacturing cost, and by simplifying a manufacturing process, it is possible to suppress failures occurring during the manufacturing process.

Figure 6:
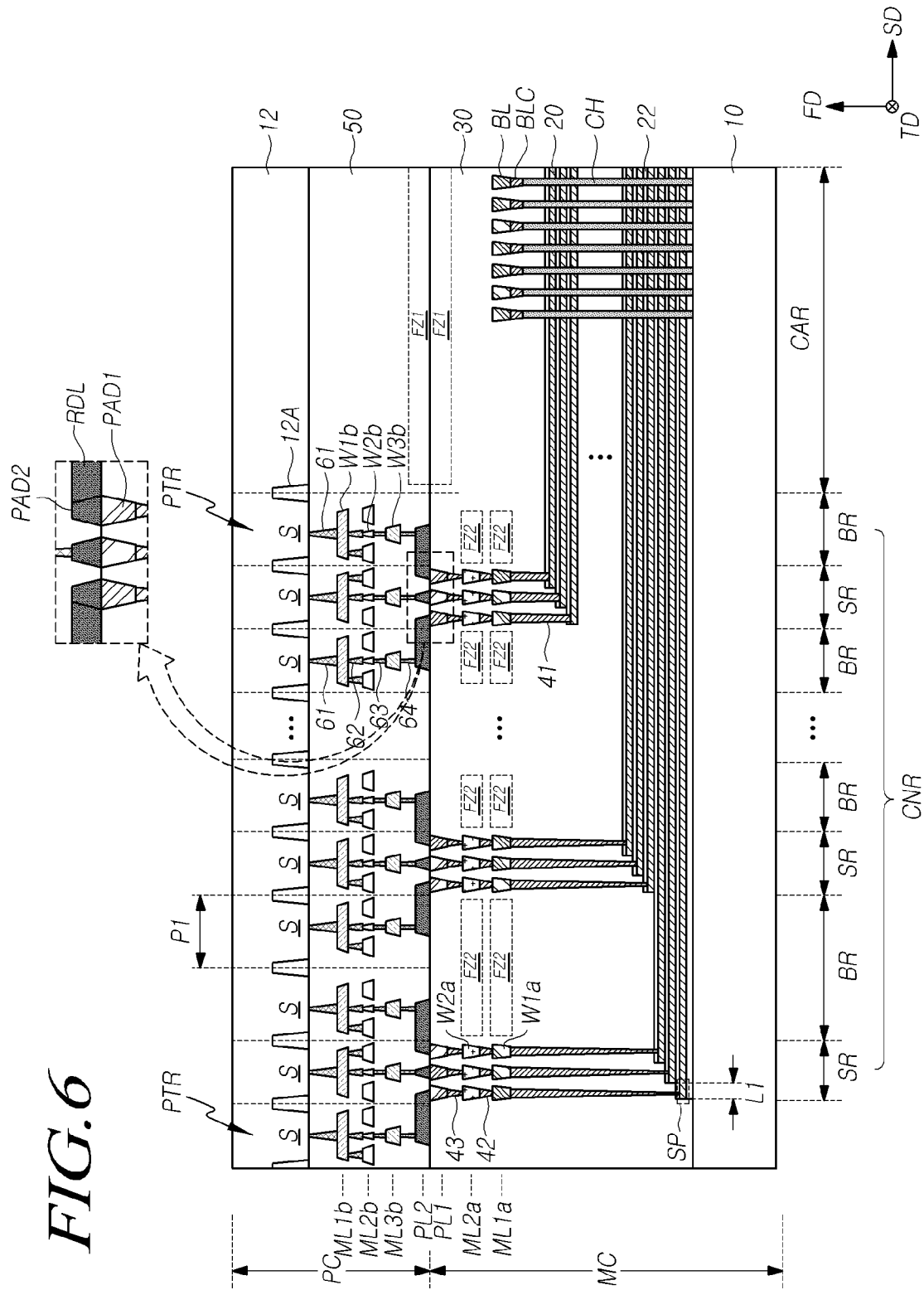
FIG. 6 is a cross-sectional view illustrating a semiconductor memory device in accordance with an embodiment of the disclosure.
Figure 7:
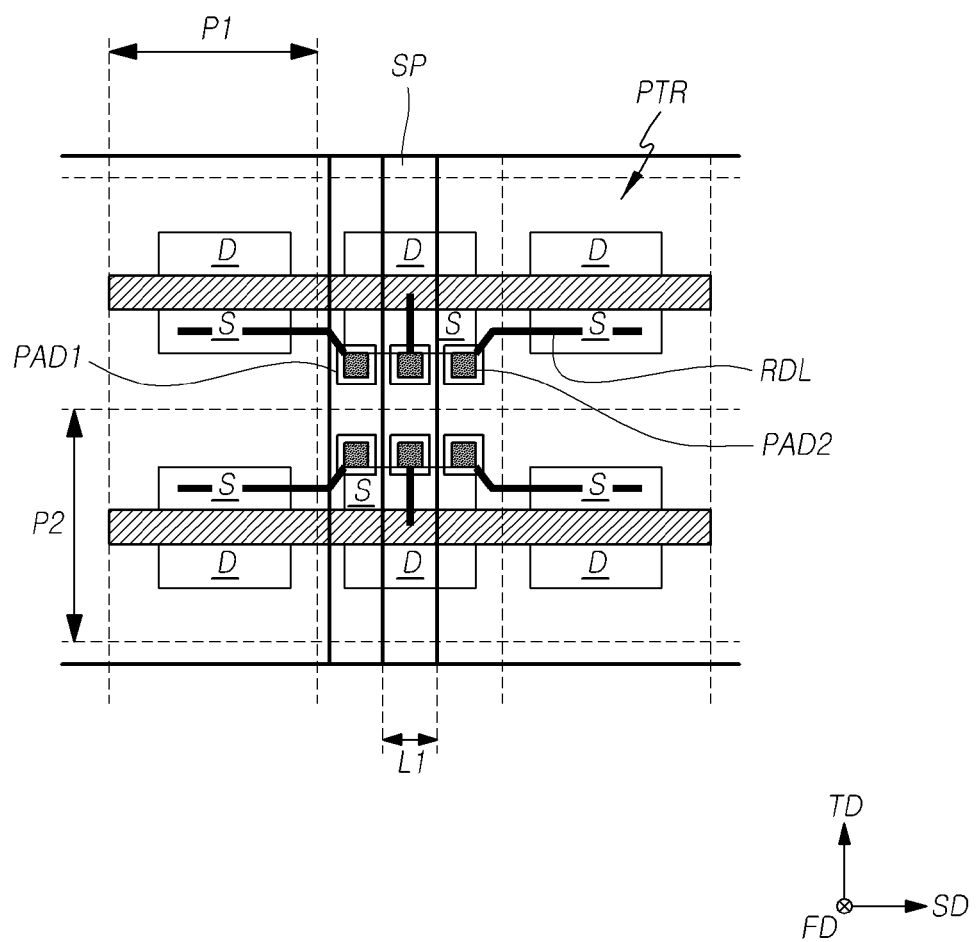
FIG. 7 is a layout diagram illustrating pass transistors, and first and second pads coupled thereto, illustrated in FIG. 6.

FIG. 6 is a cross-sectional view illustrating a semiconductor memory device in accordance with an embodiment of the disclosure. FIG. 7 is a layout diagram illustrating pass transistors, and first and second pads coupled thereto, illustrated in FIG. 6. For the sake of convenience in explanation, descriptions for components that are the same as those described above with reference to FIGS. 3 to 5 will be omitted, and only differences will be described hereunder.

Referring to FIGS. 6 and 7, the first pads PAD1 may be aligned with the step portions SP, with the same pitch as the step portions SP. Each of the first pads PAD1 may be disposed within the pitch L1 of the step portion SP coupled thereto. The first pads PAD1 may be disposed in the step regions SR and may not be disposed in the buffer regions BR.

Like the first pads PAD1, the second pads PAD2 may also be aligned with the step portions SP, with the same pitch as the step portions SP. Each of the second pads PAD2 may be disposed within the pitch L1 of the step portion SP coupled thereto. The second pads PAD2 may be disposed in the step regions SR and may not be disposed in the buffer regions BR.

The wiring lines W1*a* and W2*a* and the contacts 41 to 43 that couple the first pad PAD1 and the step portion SP may be aligned in the first direction FD over the step portion SP, and may be disposed within the pitch L1 of the step portion SP. The wiring lines W1*a* and W2*a* and the contacts 41 to 43 that couple the first pads PAD1 and the step portions SP may be disposed in the step regions SR and may not be disposed in the buffer regions BR.

In the metal layers ML1*a* and ML2*a*, regions where the wiring lines W1*a* and W2*a* are not disposed may be defined as metal-free zones FZ2. The metal-free zones FZ2 may overlap with the buffer regions BR in the first direction FD. The metal-free zones FZ2 may be utilized for the disposition of elements required in a semiconductor memory device, for example, wiring lines, shield patterns, capacitors and the likes.

Due to the size difference between the pitch L1 of the step portions SP and the pitch P1 of the pass transistors PTR, it is possible that a step portions SP and the source regions S of the corresponding pass transistors PTR may not overlap with each other in the first direction FD. In order to couple the step portions SP and the source regions S of the pass transistors PTR that do not overlap with each other in the first direction FD, redistribution lines RDL may be defined in the second pad layer PL2 of the circuit chip PC. One end of each redistribution line RDL may be coupled to the second pad PAD2, and the other end of each redistribution line RDL may be coupled to the contact 64.

According to an embodiment described above with reference to FIGS. 6 and 7, since the redistribution lines RDL are configured in the second pad layer PL2, it is not necessary to configure a separate metal layer in the memory chip MC or the circuit chip PC for the disposition of the redistribution lines RDL. Therefore, by reducing the number of manufacturing steps required to form a metal layer, it is possible to reduce manufacturing time and manufacturing cost, and by simplifying a manufacturing process, it is possible to suppress failures occurring during the manufacturing process.

In the first and second pad layers PL1 and PL2, regions where the first and second pads PAD1 and PAD2 and the redistribution lines RDL are not disposed may be defined as pad-free zones FZ1. The pad-free zones FZ1 may not overlap with the pass transistors PTR.

The wiring lines W1$b$, W2$b$ and W3$b$ and the contacts 61 to 64 that couple each pass transistor PTR and each second pad PAD2 may be disposed within the pitch of the pass transistor PTR coupled thereto. Each of the wiring lines W1$b$, W2$b$ and W3$b$ may have a short length in order to be disposed within a pitch area of the pass transistor PTR defined by the pitch P1 in the second direction SD and the pitch P2 in the third direction TD. The same structure of the wiring lines W1$b$, W2$b$ and W3$b$ and the contacts 61 to 64 may be provided for each pitch of the pass transistors PTR, and accordingly, the wiring lines W1$b$, W2$b$ and W3$b$ and the contacts 61 to 64 may form a uniform distribution.

Figure 8:
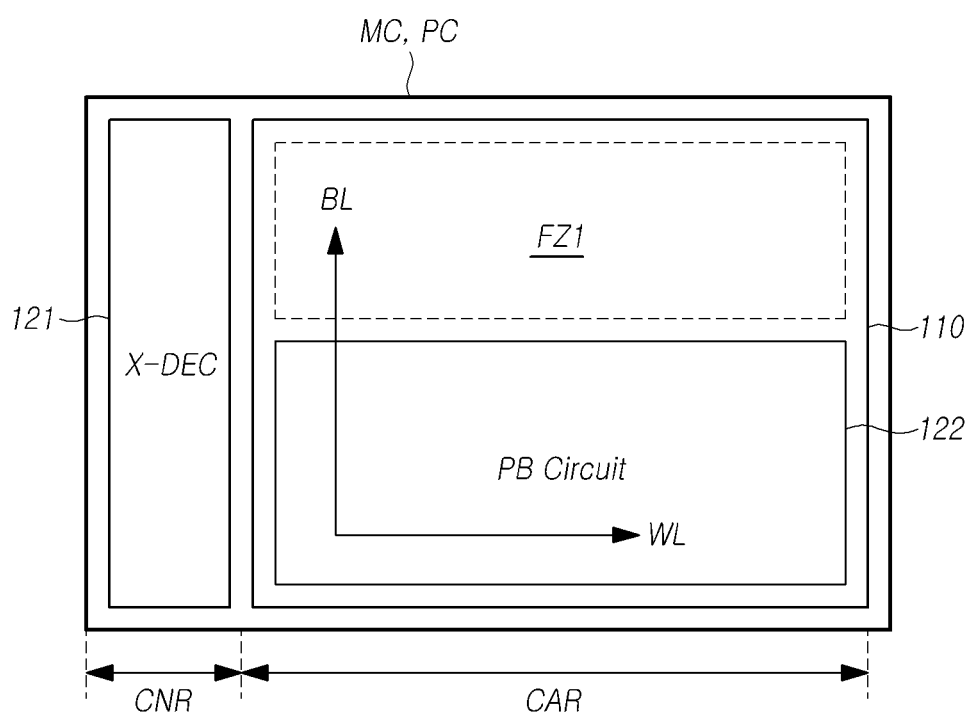
FIG. 8 is a layout diagram schematically illustrating a structure of a semiconductor memory device in accordance with an embodiment of the disclosure.
Figure 8:
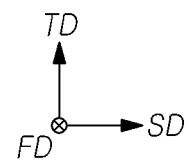

FIG. 8 is a layout diagram schematically illustrating a structure of a semiconductor memory device in accordance with an embodiment of the disclosure.

Referring to FIG. 8, a memory cell array 110 of a memory chip MC may be disposed in a cell region CAR. A row decoder 121 of a circuit chip PC may be disposed in a coupling region CNR. The row decoder 121 may be disposed to have a shape extending in a direction perpendicular to the extending direction of word lines WL, that is, the third direction TD, which is also the arrangement direction of the word lines WL. A page buffer circuit 122 of the circuit chip PC may be disposed in the cell region CAR. The page buffer circuit 122 may be disposed to have a shape extending in a direction perpendicular to the extending direction of bit lines BL, that is, the second direction SD, which is also the arrangement direction of the bit lines BL. The page buffer circuit 122 may overlap with the memory cell array 110 in the first direction FD.

The row decoder 121 may include a plurality of pass transistors. In the coupling region CNR where the row decoder 121 is positioned, pads, which couple electrode layers coupled to the memory cell array 110 and the pass transistors, may be disposed in a pad layer of the memory chip MC and a pad layer of the circuit chip PC.

In a portion of the cell region CAR where the page buffer circuit 122 is positioned, pads, which couple the bit lines BL of the memory cell array 110 and the page buffer circuit 122, may be disposed in the pad layer of the memory chip MC and the pad layer of the circuit chip PC. A pad-free zone FZ1 may be provided in the pad layer of the memory chip MC and the pad layer of the circuit chip PC, in the cell region CAR outside the page buffer circuit 122.

Figure 9:
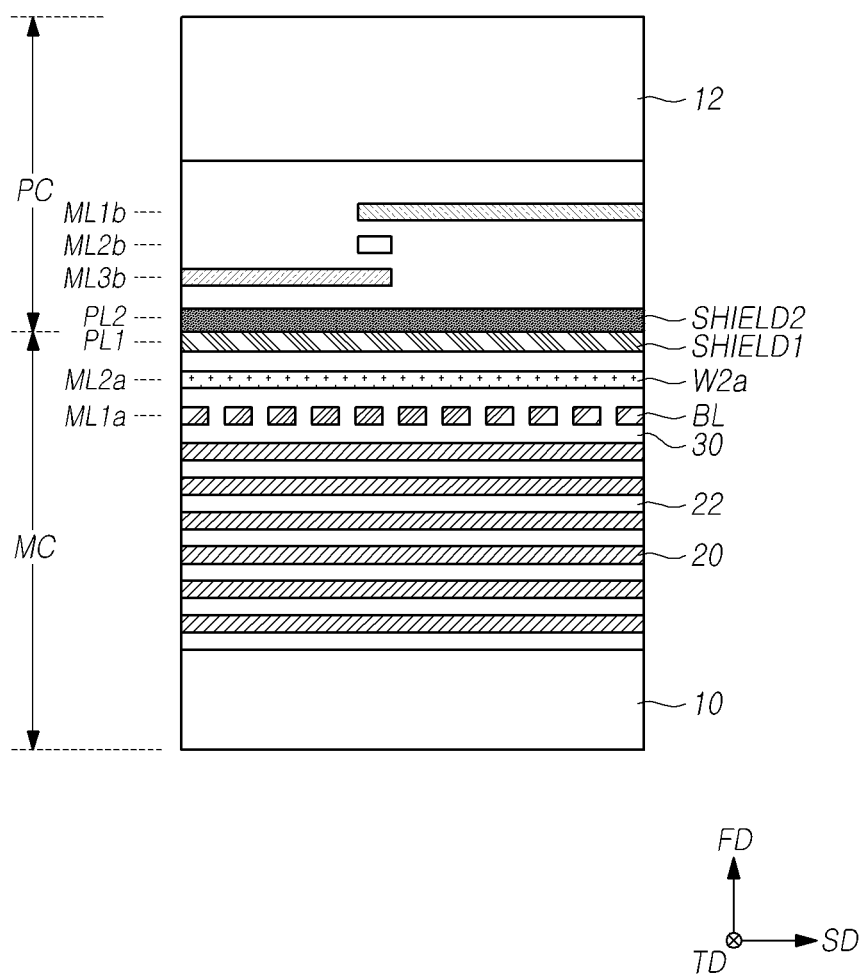
FIGS. 9 to 11 are cross-sectional views illustrating pad-free zones of semiconductor memory devices in accordance with embodiments of the disclosure.
Figure 10:
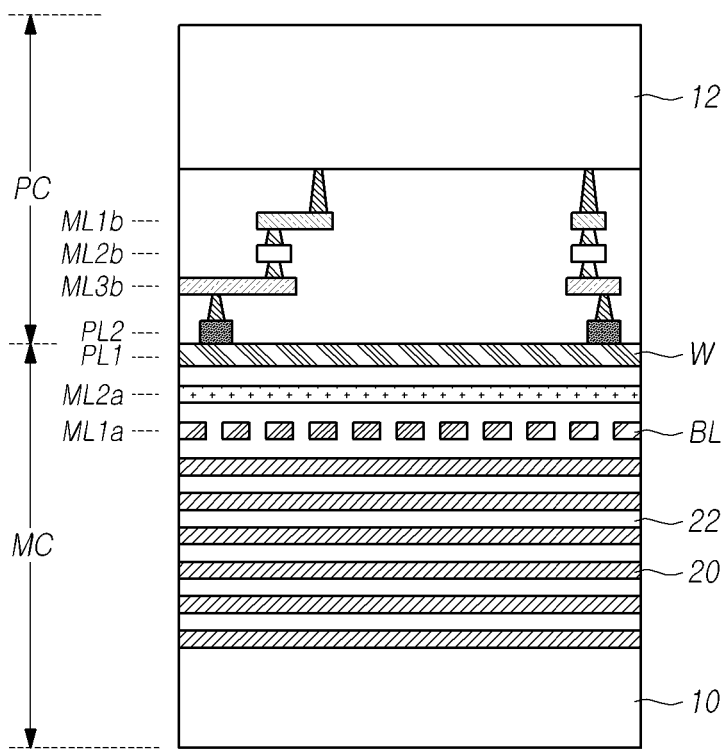
Figure 10:
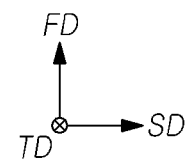
Figure 11:
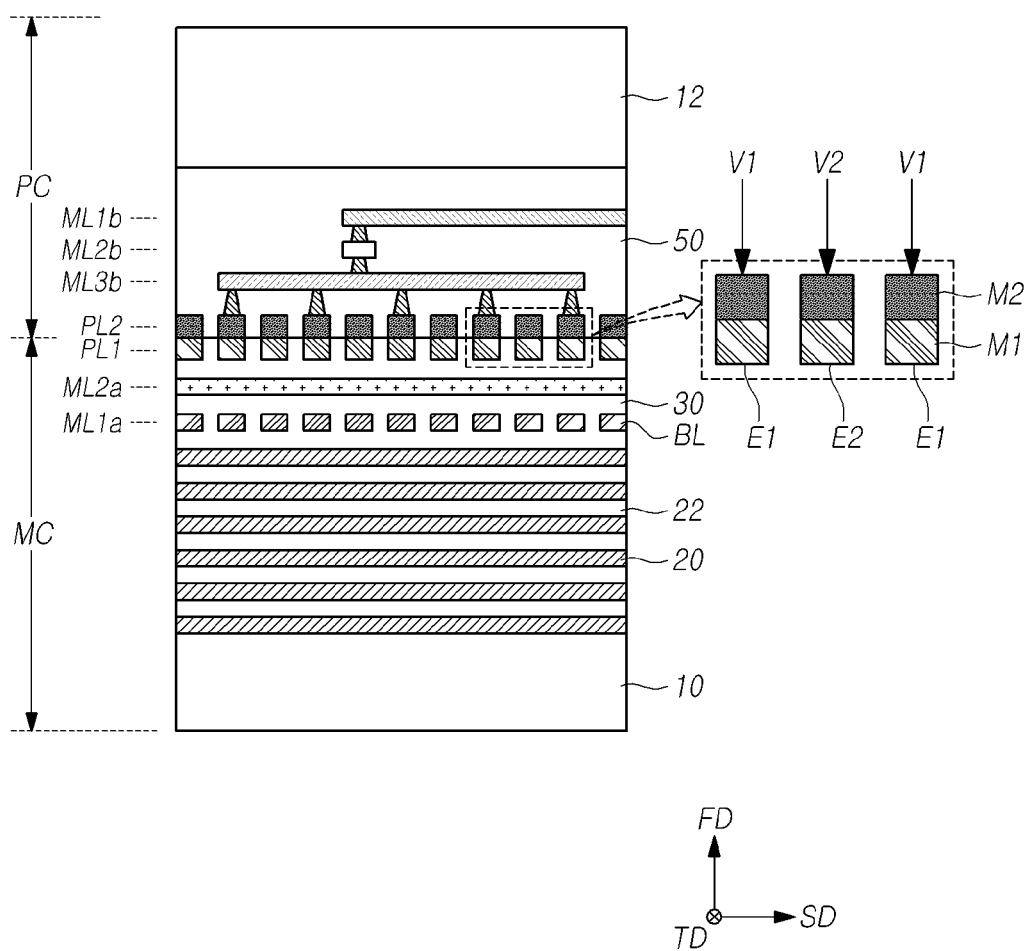

FIGS. 9 to 11 are cross-sectional views illustrating pad-free zones of semiconductor memory devices in accordance with embodiments of the disclosure.

Referring to FIG. 9, a wiring line W2$a$ that configures a source line may be defined in a metal layer ML2$a$ of a memory chip MC. The wiring line W2$a$ may be coupled to a first substrate 10 to transfer a voltage to the first substrate 10. The wiring line W2$a$ may overlap with bit lines BL in the first direction FD. In a region where the wiring line W2$a$ overlaps with each bit line BL, there may be configured a coupling capacitor constituted by a first electrode made of the wiring line W2$a$, a second electrode made of the bit line BL and a dielectric layer made of a first dielectric layer 30 between the wiring line W2$a$ and the bit line BL. In an erase operation, an erase voltage may be applied to the first substrate 10 and the bit lines BL through the wiring line W2$a$.

If the erase voltage having a high level is applied to the wiring line W2$a$, voltages of wiring lines W1$b$ to W3$b$ of a circuit chip PC may undesirably increase under influence from the erase voltage applied to the wiring line W2$a$ due to the coupling between the wiring line W2$a$ of the memory chip MC and the wiring lines W1$b$ to W3$b$ of the circuit chip PC. Accordingly, the operating characteristics of the semiconductor memory device may be degraded and the reliability of the semiconductor memory device may deteriorate.

To address this possibility, shield patterns SHIELD1 and SHIELD2 may be defined in a pad-free zone of a first pad layer PL1 and a pad-free zone of a second pad layer PL2, respectively. A constant voltage may be loaded to the shield patterns SHIELD1 and SHIELD2 regardless of whether the memory chip MC and the circuit chip PC operate. For example, the constant voltage may be a ground voltage. The shield patterns SHIELD1 and SHIELD2 may suppress the unnecessary coupling between the memory chip MC and the circuit chip PC, and may reduce degradation in the operating characteristics of the semiconductor memory device due to the unnecessary coupling.

While the embodiment described above with reference to FIG. 9 illustrates a case in which shield patterns are configured in both the first pad layer PL1 of the memory chip MC and the second pad layer PL2 of the circuit chip PC, it is to be noted that the disclosure is not limited thereto. In other embodiments, a shield pattern may be configured only in any one of the first pad layer PL1 of the memory chip MC and the second pad layer PL2 of the circuit chip PC.

According to embodiments of the disclosure, since a continuous pad-free zone having a wide area may be provided, it is possible to dispose a continuous shield pattern having a wide area, in the pad-free zone. Accordingly, it is possible to more effectively suppress the coupling between the memory chip MC and the circuit chip PC, which contributes to improving the operating characteristics and reliability of the semiconductor memory device.

Referring to FIG. 10, a wiring line W may be disposed in a pad-free zone of a first pad layer PL1 of a memory chip MC. The pad-free zone of the first pad layer PL1 of the memory chip MC may be utilized for the disposition of the wiring line W. The wiring line W may include a power line that transfers a power supply voltage, a ground line that transfers a ground voltage, and a signal line that transfers a signal.

According to embodiments of the disclosure, since a continuous pad-free zone having a wide area may be provided, it is possible to increase the number of wiring lines disposed in the pad-free zone. Accordingly, since the number of wiring lines to be formed in a circuit chip PC may be reduced, it is possible to contribute to reducing the number of metal layers of the circuit chip PC. Further, by reducing the number of manufacturing steps required to form fewer metal layers, it is possible to reduce manufacturing time and manufacturing cost, and by simplifying a manufacturing process, it is possible to suppress failures occurring during the manufacturing process.

Referring to FIG. 11, first electrodes E1 and second electrodes E2 may be alternately disposed in a pad-free zone of a first pad layer PL1 of a memory chip MC and a pad-free zone of a second pad layer PL2 of a circuit chip PC. A capacitor which is constituted by a first electrode E1 and a second electrode E2 adjacent to each other and dielectric layers 30 and 50 therebetween may be configured. Each of the first electrodes E1 and the second electrodes E2 may have a structure in which a first conductive pattern M1 defined in the pad-free zone of the first pad layer PL1 and a second conductive pattern M2 defined in the pad-free zone of the second pad layer PL2 are stacked. While the embodiment illustrates a case in which each of the first electrodes E1 and the second electrodes E2 includes a first conductive pattern M1 stacked with a second conductive pattern M2, it is to be noted that the disclosure is not limited thereto. Each of the first electrodes E1 and the second electrodes E2 may be configured by either the first conductive pattern M1 or the second conductive pattern M2.

Power is required to operate a semiconductor memory device. When power is supplied, noise is accompanied, so that a voltage level of the power may become unstable. Any one of the first electrode E1 and the second electrode E2 may be coupled to first power V1, and the other electrode may be coupled to second power V2. The first power V1 may correspond to a power supply voltage (Vcc), and the second power V2 may correspond to a ground voltage (Vss). The capacitor may configure a reservoir capacitor which stabilizes the supply of power.

According to embodiments of the disclosure, since a continuous pad-free zone having a wide area may be provided, it is possible to dispose a large-capacity reservoir capacitor in the pad-free zone. Accordingly, it is possible to contribute to improving the power supply stability of the semiconductor memory device.

Figure 12:
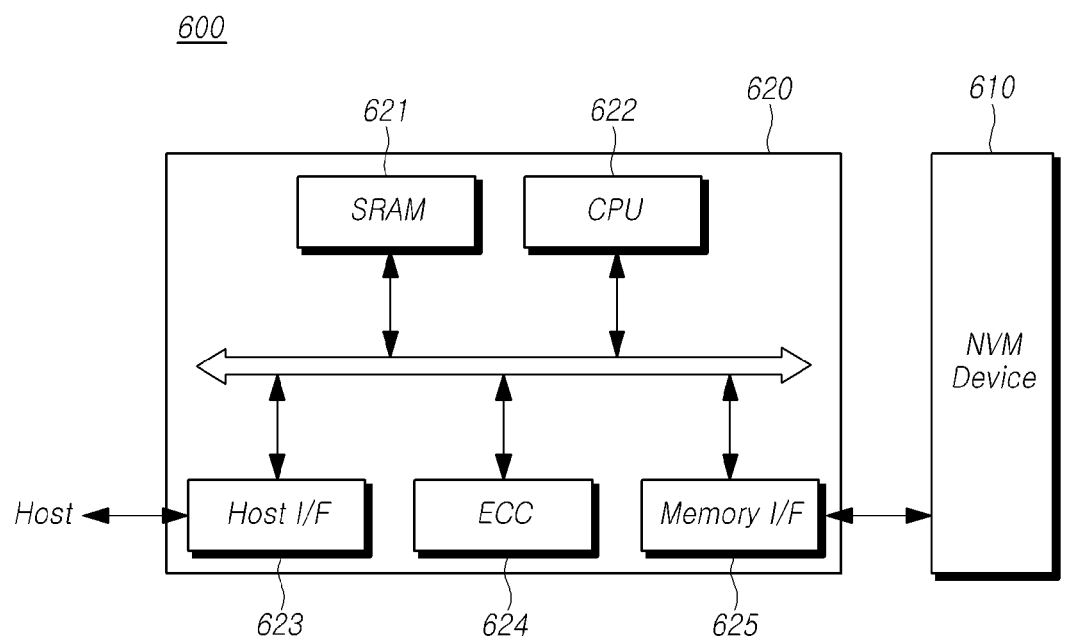
FIG. 12 is a diagram schematically illustrating a memory system including a semiconductor memory device in accordance with embodiments of the disclosure.

FIG. 12 is a block diagram schematically illustrating a memory system including a semiconductor memory device in accordance with embodiments of the disclosure.

Referring to FIG. 12, a memory system 600 in accordance with an embodiment may include a nonvolatile memory device 610 and a memory controller 620.

The nonvolatile memory device (NVM Device) 610 may be constituted by the semiconductor memory device described above and may operate in the manner described above. The memory controller 620 may be configured to control the nonvolatile memory device 610. By the combination of the nonvolatile memory device 610 and the memory controller 620, a memory card or a solid state disk (SSD) may be provided. An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 13:
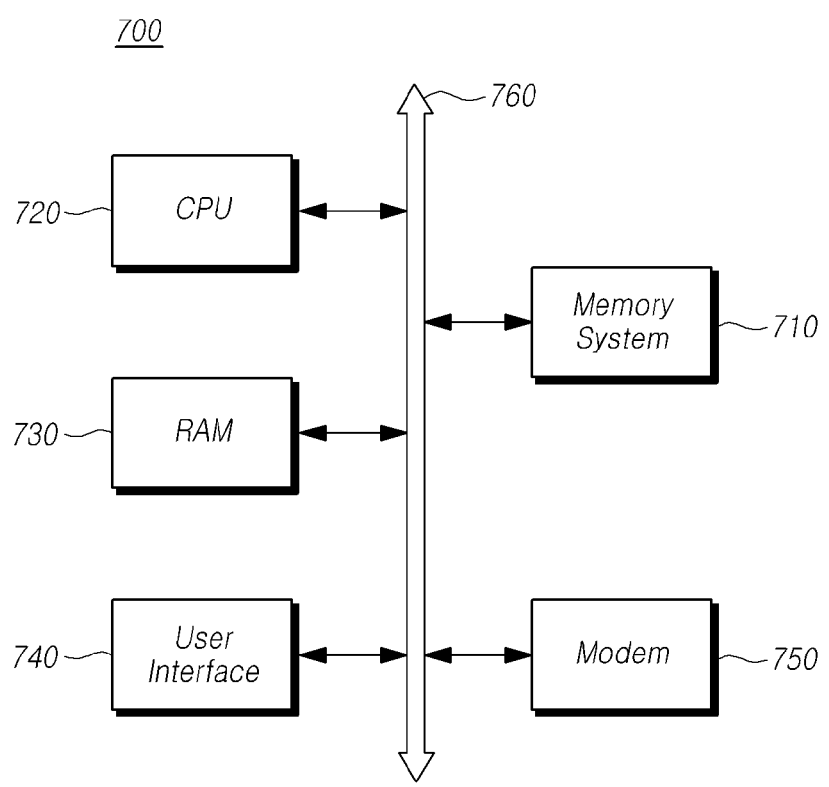
FIG. 13 is a block diagram schematically illustrating a computing system including a semiconductor memory device in accordance with embodiments of the disclosure.

FIG. 13 is a block diagram schematically illustrating a computing system including a semiconductor memory device in accordance with embodiments of the disclosure.

Referring to FIG. 13, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor memory device comprising:
   a plurality of first pads, disposed in one surface of a memory chip,
   a plurality of row lines, included in a memory cell array of the memory chip; and
   a plurality of second pads, disposed in one surface of a circuit chip and bonded to the plurality of first pads, coupled to a plurality of pass transistors of the circuit chip,
   wherein each of the plurality of row lines terminates in a step portion that projects further than above row lines,
   wherein the plurality of first pads is coupled to the plurality of row lines through the step portions,
   wherein the second pads are aligned with the pass transistors at the same pitch as a pitch of the pass transistors.

2. The semiconductor memory device according to claim 1,
   wherein the circuit chip includes wiring lines and contacts which couple the second pads and the pass transistors, and wherein each of the wiring lines and the contacts is disposed within a pitch of a pass transistor coupled thereto.

3. The semiconductor memory device according to claim 1,
wherein the first pads are disposed in a first pad layer of the one surface of the memory chip, and the second pads are disposed in a second pad layer of the one surface of the circuit chip, and
wherein each of the first and second pad layers includes a pad-free zone where the first and second pads are not disposed, and the pad-free zone does not overlap with the pass transistors.

4. The semiconductor memory device according to claim 3, further comprising:
a wiring line disposed in the pad-free zone.

5. A semiconductor memory device comprising:
a plurality of first pads, disposed in one surface of a memory chip, coupled to a plurality of row lines, included in a memory cell array of the memory chip;
a plurality of second pads, disposed in one surface of a circuit chip and bonded to the plurality of first pads, coupled to a plurality of pass transistors of the circuit chip; and
a shield pattern disposed in the pad-free zone, and having a constant potential independent of an operation of the memory chip or the circuit chip,
wherein the second pads are aligned with the pass transistors at the same pitch as a pitch of the pass transistors,
wherein the first pads are disposed in a first pad layer of the one surface of the memory chip, and the second pads are disposed in a second pad layer of the one surface of the circuit chip, and
wherein each of the first and second pad layers includes a pad-free zone where the first and second pads are not disposed, and the pad-free zone does not overlap with the pass transistors.

6. The semiconductor memory device according to claim 5, further comprising:
a capacitor, disposed in the pad-free zone, configured by a first electrode, a second electrode, and a dielectric layer between the first electrode and the second electrode.

7. The semiconductor memory device according to claim 6, wherein one of the first and second electrodes of the capacitor is coupled to a power supply voltage, and the other electrode is coupled to a ground voltage.

8. The semiconductor memory device according to claim 1, wherein the memory chip comprises:
a first substrate;
a plurality of interlayer dielectric layers alternately stacked on the first substrate with the plurality of row lines; and
a plurality of vertical channels passing through the plurality of row lines and the plurality of interlayer dielectric layers.

9. A semiconductor memory device comprising:
a memory chip, and a circuit chip bonded onto the memory chip,
wherein the memory chip includes a memory cell array having a plurality of row lines, and a first pad layer with a plurality of first pads,
wherein each of the plurality of row lines terminates in a step portion that projects further than above row lines,
wherein the plurality of first pads is coupled to the plurality of row lines through the step portions,
wherein the circuit chip includes a plurality of pass transistors, and a second pad layer with a plurality of second pads that are respectively coupled to the plurality of pass transistors and respectively bonded to the plurality of first pads and
wherein each of the plurality of second pads is disposed within a pitch of a corresponding pass transistor.

10. The semiconductor memory device according to claim 9,
wherein the circuit chip further includes wiring lines and contacts that couple the plurality of second pads and the plurality of pass transistors, and
wherein each of the wiring lines and the contacts is disposed within a pitch of a corresponding pass transistor.

11. The semiconductor memory device according to claim 9,
wherein the first and second pad layers include a pad-free zone where the first and second pads are not disposed, and
wherein the pad-free zone does not overlap with the plurality of pass transistors.

12. The semiconductor memory device according to claim 11, further comprising:
a wiring line disposed in the pad-free zone.

13. The semiconductor memory device according to claim 11, further comprising:
a shield pattern, disposed in the pad-free zone, having constant potential regardless of whether the memory chip and the circuit chip operate.

14. The semiconductor memory device according to claim 11, further comprising:
a capacitor configured by a first electrode and a second electrode disposed in the pad-free zone and a dielectric layer between the first electrode and the second electrode.

15. The semiconductor memory device according to claim 14, wherein one of the first and second electrodes of the capacitor is coupled to a power supply voltage, and the other electrode is coupled to a ground voltage.

16. The semiconductor memory device according to claim 3, further comprising:
a capacitor, disposed in the pad-free zone, configured by a first electrode, a second electrode, and a dielectric layer between the first electrode and the second electrode.

17. The semiconductor memory device according to claim 16, wherein one of the first and second electrodes of the capacitor is coupled to a power supply voltage, and the other electrode is coupled to a ground voltage.

* * * * *